US012690402B2

(12) United States Patent
Yamauchi et al.

(10) Patent No.:  US 12,690,402 B2
(45) Date of Patent:  Jul. 21, 2026

(54) SURFACE TREATMENT METHOD, DRY ETCHING METHOD, CLEANING METHOD, PRODUCTION METHOD FOR SEMICONDUCTOR DEVICE, AND ETCHING DEVICE

(71) Applicant: CENTRAL GLASS COMPANY, LIMITED, Yamaguchi (JP)

(72) Inventors: Kunihiro Yamauchi, Yamaguchi (JP); Hikaru Kitayama, Yamaguchi (JP); Akiou Kikuchi, Yamaguchi (JP)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 108 days.

(21) Appl. No.: 18/286,310

(22) PCT Filed: Apr. 26, 2022

(86) PCT No.: PCT/JP2022/018847
§ 371 (c)(1),
(2) Date: Oct. 10, 2023

(87) PCT Pub. No.: WO2022/230859
PCT Pub. Date: Nov. 3, 2022

(65) Prior Publication Data
US 2024/0194490 A1      Jun. 13, 2024

(30) Foreign Application Priority Data
Apr. 28, 2021      (JP) ................................. 2021-075900

(51) Int. Cl.
*H10P 50/24*      (2026.01)
*C09K 13/00*      (2006.01)
*H10P 50/28*      (2026.01)

(52) U.S. Cl.
CPC ............ *H10P 50/242* (2026.01); *C09K 13/00* (2013.01); *H10P 50/285* (2026.01)

(58) Field of Classification Search
None
See application file for complete search history.

(56) References Cited

U.S. PATENT DOCUMENTS

| | | | |
|---|---|---|---|
| 11,335,573 B2 | 5/2022 | Yamauchi et al. | |
| 11,618,954 B2 | 4/2023 | Takeda et al. | |

(Continued)

FOREIGN PATENT DOCUMENTS

| | | | |
|---|---|---|---|
| CN | 1575328 | 2/2005 | |
| CN | 106663626 | 5/2017 | |

(Continued)

OTHER PUBLICATIONS

International Search Report issued Jun. 28, 2022 in International Application No. PCT/JP2022/018850, with English translation.

(Continued)

*Primary Examiner* — Allan W. Olsen
(74) *Attorney, Agent, or Firm* — Wenderoth, Lind & Ponack, L.L.P.

(57) ABSTRACT

The present disclosure aims to provide a surface treatment method using a gas composition capable of removing a metal oxide or metal at low temperatures without using plasma. The present disclosure provides a surface treatment method including bringing a gas into contact with a surface of a workpiece, wherein the gas contains a β-diketone, a first additive gas, and a second additive gas, the first additive gas is NO, and the second additive gas is at least one selected from the group consisting of $O_2$ and $NO_2$.

1 Claim, 1 Drawing Sheet

(56) References Cited

U.S. PATENT DOCUMENTS

| | | | |
|---|---|---|---|
| 2005/0142885 A1 | 6/2005 | Shinriki | |
| 2012/0180811 A1 | 7/2012 | Gunji et al. | |
| 2014/0352716 A1 | 12/2014 | Kikuchi et al. | |
| 2015/0047680 A1 | 2/2015 | Umezaki et al. | |
| 2015/0270140 A1 | 9/2015 | Gupta et al. | |
| 2016/0111294 A1 | 4/2016 | Berry, III et al. | |
| 2017/0032990 A1 | 2/2017 | Lin et al. | |
| 2017/0200602 A1 | 7/2017 | Kikuchi et al. | |
| 2018/0138053 A1 | 5/2018 | Yao et al. | |
| 2018/0211844 A1 | 7/2018 | Lin et al. | |
| 2019/0348307 A1 | 11/2019 | Yamauchi et al. | |
| 2020/0066541 A1 | 2/2020 | Yamauchi et al. | |
| 2020/0135455 A1 | 4/2020 | Nakatani et al. | |
| 2021/0090912 A1* | 3/2021 | Shindo | H01L 21/68757 |
| 2021/0287915 A1* | 9/2021 | Yao | H01L 21/68742 |
| 2021/0358760 A1 | 11/2021 | Fujisaki et al. | |
| 2022/0020598 A1 | 1/2022 | Nakatani et al. | |
| 2022/0056593 A1 | 2/2022 | Takeda et al. | |
| 2022/0415667 A1 | 12/2022 | Yamauchi et al. | |
| 2024/0186147 A1 | 6/2024 | Kitayama et al. | |

FOREIGN PATENT DOCUMENTS

| | | |
|---|---|---|
| EP | 4 560 683 | 5/2025 |
| JP | 9-330916 | 12/1997 |
| JP | 2004-91829 | 3/2004 |
| JP | 2005-101361 | 4/2005 |
| JP | 2006-080103 | 3/2006 |
| JP | 2012-149288 | 8/2012 |
| JP | 2013-194307 | 9/2013 |
| JP | 2014-236096 | 12/2014 |
| JP | 2017-29198 | 2/2017 |
| JP | 2017-059824 | 3/2017 |
| JP | 2018-60854 | 4/2018 |
| JP | 2022-18973 | 1/2022 |
| KR | 10-2021-0010656 | 1/2021 |
| TW | 201445634 | 12/2014 |
| TW | 202030793 | 8/2020 |
| WO | 03/0355797 | 5/2003 |
| WO | 2017/010194 | 1/2017 |
| WO | 2018/020822 | 2/2018 |
| WO | 2018/128079 | 7/2018 |
| WO | 2020/179449 | 9/2020 |
| WO | 2021/079624 | 4/2021 |
| WO | 2022/230862 | 11/2022 |
| WO | 2024/019025 | 1/2024 |

OTHER PUBLICATIONS

U.S. Appl. No. 18/286,306, filed Oct. 10, 2023 in the name of Hikaru Kitayama et al.

Translation of the International Search Report issued Jun. 28, 2022 in corresponding International Application No. PCT/JP2022/018847.

Notice of Allowance and Fee(s) Due issued Mar. 17, 2025 in corresponding U.S. Appl. No. 18/286,306.

Johnson et al., "Thermal atomic layer etching of crystalline aluminum nitride using sequential, self-limiting hydrogen fluoride and $Sn(acac)_2$ reactions and enhancement by $H_2$ and Ar plasmas", Journal of Vacuum Science Technology, vol. 34, No. 5, Sep./Oct. 2016, pp. 050603-1 to 050603-5.

* cited by examiner

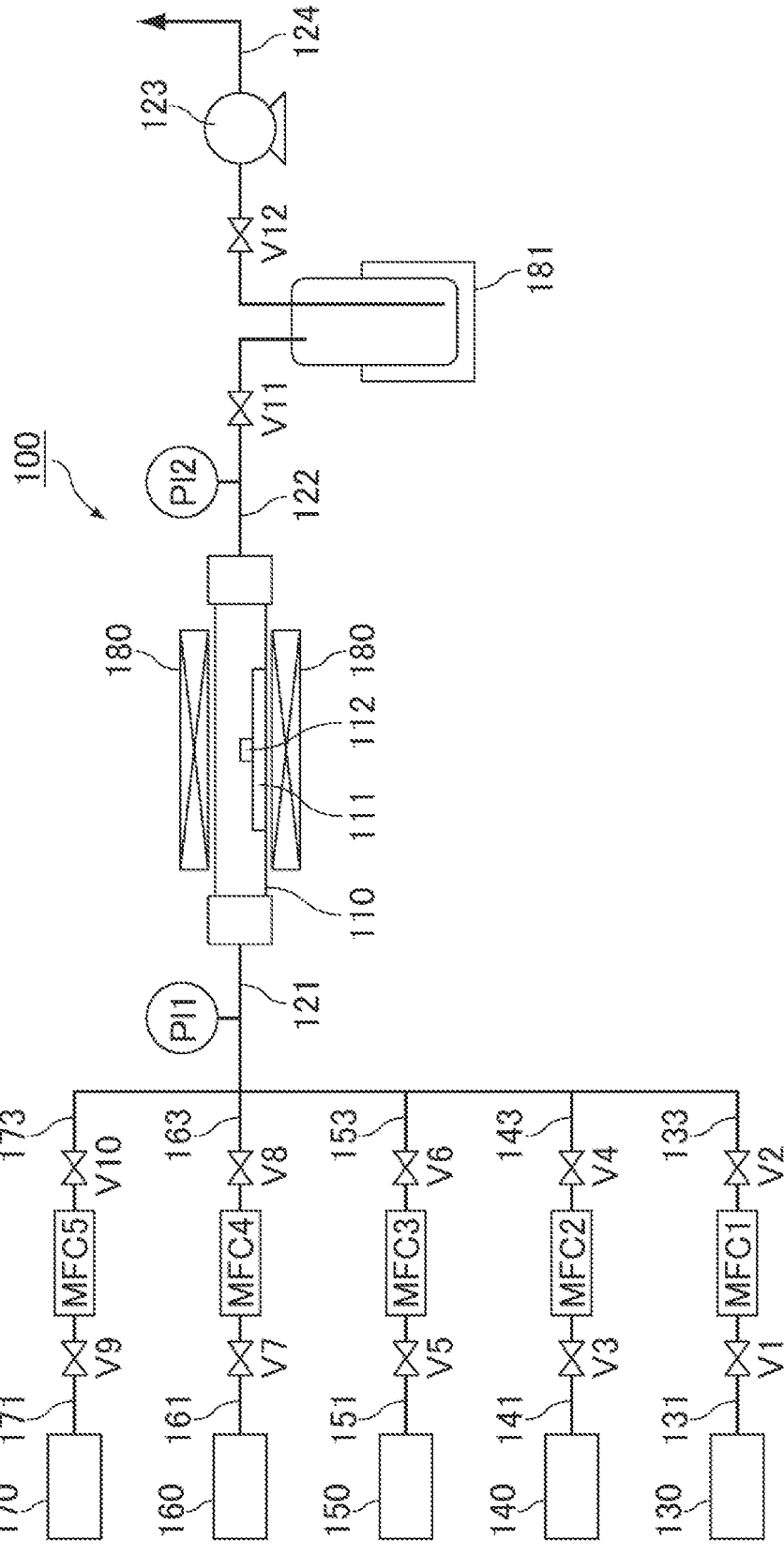

SURFACE TREATMENT METHOD, DRY ETCHING METHOD, CLEANING METHOD, PRODUCTION METHOD FOR SEMICONDUCTOR DEVICE, AND ETCHING DEVICE

TECHNICAL FIELD

The present disclosure relates to a surface treatment method, a dry etching method, a cleaning method, a semiconductor device production method, and an etching device.

BACKGROUND ART

With the miniaturization of semiconductor devices, the thinning of gate insulating films has been advancing, causing the problem of increased leakage current. Thus, the application of high dielectric constant materials such as $HfO_x$ is being considered to reduce leakage current. This process requires a step of etching $HfO_x$, which is a hard-to-etch material.

Patent Literature 1 discloses a cleaning method for removing a deposit ($HfO_2$, etc.) in a processing vessel. This technique includes treatment with a first cleaning gas containing a $\beta$-diketone, $O_2$, $N_2$, and $H_2O$, followed by cleaning the uncleanable residue using plasma containing F radicals and Ar ions.

Patent Literature 2 discloses, in relation to methods for producing MOS transistors and the like, a method of etching a metal film or metal oxide film containing at least one of Al, Zr, Hf, Y, La, Ce, and Pr formed on a substrate. In this method, an etching gas containing a $\beta$-diketone is used to reduce damage to the substrate. The literature discloses in Examples a method of etching a $HfO_2$ film at a wafer temperature of about 450° C. using a hexafluoroacetylacetone gas supplemented with oxygen.

CITATION LIST

Patent Literature

Patent Literature 1: JP 2005-101361 A
Patent Literature 2: JP 2004-91829 A

SUMMARY OF INVENTION

Technical Problem

As described above, techniques have been developed to use high dielectric constant materials as gate insulating films in response to the miniaturization of circuit patterns of semiconductor devices. However, many high dielectric constant materials such as hafnium oxides are hard-to-etch materials.

According to the invention of Patent Literature 1, etching of $HfO_2$ at a high etching rate requires etching at a temperature as high as 380° C. to 420° C.

According to the invention of Patent Literature 2, it is disclosed that the etching gas preferably contains at least one of water and alcohol in addition to oxygen, and that etching does not proceed at a wafer temperature as low as 400° C. or lower. In other words, FIG. 9 of Patent Literature 2 shows that etching using a gas mixture of hexafluoroacetylacetone and oxygen does not proceed at a wafer temperature of 400° C. or lower.

Since an etching step at a wafer temperature higher than 400° C. can cause great damage to semiconductor devices, there has been a need for a method that can etch a hafnium oxide or the like at low temperatures of 400° C. or lower, preferably 350° C. or lower.

In view of the above problems, the present disclosure aims to provide a surface treatment method using a gas composition capable of removing a metal oxide or metal at low temperatures without using plasma. The present disclosure also aims to provide a dry etching method, a cleaning method, etc., which include the surface treatment method.

Solution to Problem

As a result of extensive studies, the inventors of the present disclosure have found that use of a gas mixture containing a $\beta$-diketone, NO, and $O_2$ and/or $NO_2$ makes it possible to remove highly stable materials, such as $HfO_x$, at low temperatures and at high rates. This finding has led to the completion of the present disclosure.

Specifically, a surface treatment method according to the present disclosure includes bringing a gas into contact with a surface of a workpiece, wherein the gas contains a $\beta$-diketone, a first additive gas, and a second additive gas, the first additive gas is NO, and the second additive gas is at least one selected from the group consisting of $O_2$ and $NO_2$.

A dry etching method according to the present disclosure includes bringing an etching gas into contact with an etching target film for etching in a non-plasma state, the etching target film being formed on a surface of a workpiece and containing a metal or an oxide of the metal, wherein the etching gas contains a $\beta$-diketone, a first additive gas, and a second additive gas, the first additive gas is NO, and the second additive gas is at least one selected from the group consisting of $O_2$ and $NO_2$.

A cleaning method according to the present disclosure includes bringing a gas into contact with a deposit in a processing vessel of a substrate processing device, deposited on a surface of the processing vessel, to remove the deposit, wherein the gas contains a $\beta$-diketone, a first additive gas, and a second additive gas, the first additive gas is NO, and the second additive gas is at least one selected from the group consisting of $O_2$ and $NO_2$.

A semiconductor device production method according to the present disclosure includes allowing an etching target film containing a metal or an oxide of the metal on a substrate to react with an etching gas for etching in a non-plasma state, wherein the etching gas contains a $\beta$-diketone, a first additive gas, and a second additive gas, the first additive gas is NO, and the second additive gas is at least one selected from the group consisting of $O_2$ and $NO_2$.

An etching device according to the present disclosure includes: a placement unit provided in a heatable processing vessel, for placing a workpiece on a surface of which an etching target film containing a metal or an oxide of the metal is formed; a $\beta$-diketone supply unit for supplying a $\beta$-diketone into the processing vessel; a first additive gas supply unit for supplying a first additive gas into the processing vessel; and a second additive gas supply unit for supplying a second additive gas into the processing vessel, wherein the first additive gas is NO, and the second additive gas is at least one selected from the group consisting of $O_2$ and $NO_2$.

Advantageous Effects of Invention

The present disclosure can provide a surface treatment method using a gas composition capable of removing a metal oxide or metal at low temperatures without using plasma.

BRIEF DESCRIPTION OF DRAWINGS

FIG. 1 is a schematic view schematically showing an etching device according to an embodiment of the present disclosure.

DESCRIPTION OF EMBODIMENTS

Hereinafter, embodiments of the present disclosure are described specifically.

However, the present disclosure is not limited to the following embodiments, which can be modified and applied as appropriate without changing the gist of the present disclosure.

[Surface Treatment Method]

The surface treatment method of the present disclosure is a surface treatment method including bringing a gas into contact with a surface of a workpiece, wherein the gas contains a β-diketone, a first additive gas, and a second additive gas, the first additive gas is NO, and the second additive gas is at least one selected from the group consisting of $O_2$ and $NO_2$.

The surface treatment method of the present disclosure is suitable as a method for removing a material present on the surface of a workpiece from the surface of the workpiece.

The material may be a metal or an oxide of the metal, for example. The metal or the oxide of the metal is desirably at least one selected from the group consisting of group 4 metals, group 12 metals, group 13 metals, group 14 metals, and oxides of these metals.

The metal or the oxide of the metal is more desirably at least one selected from the group consisting of Hf (hafnium), Zr (zirconium), Ti (titanium), Ga (gallium), Al (aluminum), In (indium), Zn (zinc), and oxides of these metals (hafnium oxides, zirconium oxides, titanium oxides, gallium oxides, aluminum oxides, indium oxides, and zinc oxides). The material may be any one of the above-listed metals or metal oxides alone, or may be an alloy containing two or more of these metals or an oxide of the alloy.

Examples of the hafnium oxides include hafnium oxide ($HfO_x$, wherein x is 1 or greater and 3 or smaller, particularly $HfO_2$), hafnium silicon oxide, hafnium aluminum oxide, and hafnium zirconium oxide. Examples of the hafnium silicon oxide include $Hf_{1-k}Si_kO_y$ and $Hf_{1-k}Si_kO_yN_z$. Examples of the hafnium aluminum oxide include $Hf_{1-k}Al_kO_m$ and $Hf_{1-k}Al_kO_mN_n$. Here, k, y, z, m, and n represent the following: $0<k<1$; $0<y\leq2$; $0<z\leq1.33$; $0<m\leq1.5$; and $0<n\leq1$.

Examples of the hafnium zirconium oxide include $HfZrO_x$, wherein x is 1 or greater and 3 or smaller, particularly $HfZrO_2$.

Examples of the zirconium oxides include zirconium oxide ($ZrO_u$, wherein u is 1 or greater and 3 or smaller, particularly $ZrO_2$).

Examples of the titanium oxides include titanium oxide ($TiO_w$, wherein w is 1 or greater and 3 or smaller, particularly $TiO_2$).

Examples of the gallium oxides include gallium oxide ($GaO_p$, wherein p is 1 or greater and 2 or smaller, particularly $Ga_2O_3$).

Examples of the aluminum oxides include aluminum oxide ($AlO_v$, wherein v is 1 or greater and 2 or smaller, particularly $Al_2O_2$).

Examples of the indium oxides include indium oxide ($InO_q$, wherein q is 1 or greater and 2 or smaller, particularly $In_2O_3$), and indium gallium zinc oxide ($InGaZn_tO_{3+t}$, wherein t is 0.5 or greater and 4 or smaller, particularly $InGaZnO_4$).

Examples of the zinc oxides include zinc oxide (ZnO).

Examples of the metal or the oxide of the metal also include Sn (tin) and tin oxide ($SnO_2$). Examples of the material also include a mixture (ITO) of indium oxide ($In_2O_3$) and tin oxide ($SnO_2$)

Any type of β-diketone may be used. Examples include hexafluoroacetylacetone (HFAc, 1,1,1,5,5,5-hexafluoro-2,4-pentanedione), trifluoroacetylacetone (1,1,1-trifluoro-2,4-pentanedione), and acetylacetone (2,4-pentanedione). The β-diketone used may be a single compound or two or more compounds.

The β-diketone content in the gas is preferably 10 vol % or more and 90 vol % or less. Too little of the β-diketone in the gas tends to lead to a reduced reaction rate, whereas too much of the β-diketone makes the gas too expensive. The β-diketone content is more preferably 20 vol % or more and 80 vol % or less, still more preferably 30 vol % or more and 70 vol % or less.

In the surface treatment method of the present disclosure, the additive gas to the β-diketone includes a first additive gas and a second additive gas. The first additive gas is NO (nitrogen monoxide), and the second additive gas is at least one selected from the group consisting of $O_2$ (oxygen) and $NO_2$ (nitrogen dioxide). The gas used in the surface treatment method of the present disclosure may be a gas containing a β-diketone, NO, and $O_2$, a gas containing a β-diketone, NO, and $NO_2$, or a gas containing a β-diketone, NO, $O_2$, and $NO_2$.

The first additive gas content in the gas is preferably 0.1 vol % or more and 50 vol % or less. Either too little or too much of the first additive gas in the gas can inhibit the progress of the reaction. More preferably, the first additive gas content is 3 vol % or more and 45 vol % or less.

The second additive gas content in the gas is preferably 5 vols or more and 40 vol % or less. Either too little or too much of the second additive gas in the gas can inhibit the progress of the reaction. More preferably, the second additive gas content is 10 vol % or more and 35 vol % or less.

Although the gas may consist of the β-diketone, the first additive gas, and the second additive gas, it may further contain at least one additive gas selected from the group consisting of $N_2O$, CO, $CO_2$, $H_2O$, $H_2O_2$, and alcohols, or may further contain at least one inert gas selected from the group consisting of $N_2$, Ar, He, Ne, and Kr. Moreover, examples of the alcohols that can be used include methanol, ethanol, propanol, and isopropyl alcohol.

When the gas contains an additive gas other than the first additive gas and the second additive gas, the total content of the first additive gas, the second additive gas, and the other additive gas in the gas may be 10 vol % or more and 90 vol % or less.

When the gas contains an inert gas, the inert gas content in the gas is preferably 1 vol % or more and 80 vol % or less, more preferably 10 vol % or more and 70 vol % or less, still more preferably 30 vol % or more and 50 vol % or less.

Examples of the workpiece include semiconductor device substrates and processing vessels of substrate processing devices. For example, when the workpiece is a semiconductor device substrate, the material present on the surface of the workpiece may be an etching target film or the like. For example, when the workpiece is a processing vessel of a substrate processing device, the material present on the surface of the workpiece may be a deposit that has been deposited on the inner surface of the processing vessel by etching of an etching target film, or the like.

In the surface treatment method of the present disclosure, the gas in a plasma state may be brought into contact with the surface of the workpiece, or the gas in a non-plasma state may be brought into contact with the surface of the workpiece. However, preferably, the gas is brought into contact with the surface of the workpiece in a non-plasma state, because when the semiconductor device substrate used as the workpiece is brought into contact with the plasma gas, the substrate may be electrically damaged due to the plasma gas.

The workpiece may have any surface temperature when the gas is brought into contact with the surface of the workpiece. For example, the surface temperature is 250° C. or higher and 400° C. or lower. The temperature of the workpiece is substantially equal to the temperature of the material present on the surface of the workpiece. Bringing the gas containing the β-diketone, the first additive gas, and the second additive gas into contact with the material in a heated state causes a reaction of the gas with the metal or the oxide of the metal, forming a complex on the surface of the material. This complex, which has a high vapor pressure, can remove the material as the complex evaporates.

[Dry Etching Method]

The surface treatment method of the present disclosure described above can be used as a dry etching method for forming a predetermined pattern on a hafnium oxide film, hafnium metal, or the like formed on the surface of a workpiece. The dry etching method of the present disclosure is a dry etching method including bringing an etching gas into contact with an etching target film for etching in a non-plasma state, the etching target film being formed on a surface of a workpiece and containing a metal or an oxide of the metal, wherein the etching gas contains a β-diketone, a first additive gas, and a second additive gas, the first additive gas is NO, and the second additive gas is at least one selected from the group consisting of $O_2$ and $NO_2$.

The metal or the oxide of the metal contained in the etching target film is desirably as described above for the surface treatment method.

Further, the etching target film containing the metal or the oxide of the metal is desirably at least one selected from the group consisting of hafnium oxide films, zirconium oxide films, titanium oxide films, gallium oxide films, aluminum oxide films, indium oxide films, zinc oxide films, hafnium metal films, zirconium metal films, titanium metal films, gallium metal films, aluminum metal films, indium metal films, and zinc metal films.

The etching target film may be a film of any one of the above-listed metals or metal oxides alone, or may be a film of an alloy containing two or more of the metals or a film of an oxide of the alloy.

The dry etching method of the present disclosure can provide a dry etching method that can etch a hard-to-etch etching target film containing the metal or the oxide of the metal in a non-plasma state at a temperature of 400° C. or lower or even 350° C. or lower.

Since hexafluoroacetylacetone (hereinafter also referred to as HFAc), which is a type of β-diketone, has a decomposition temperature of 375° C., an etching temperature higher than 400° C. as disclosed in Patent Literature 2 is very likely to cause decomposition of HFAc, so that the carbon components may be deposited on the etching target film to be etched, causing inconvenience in the subsequent process.

In contrast, the dry etching method of the present disclosure uses an etching gas containing a β-diketone, NO, and $O_2$ and/or $NO_2$ and thus can lower the etching temperature to 375° C. or lower, thereby reducing the formation of a carbon film due to decomposition of the β-diketone. The dry etching method of the present disclosure can also achieve an effect of improving the etching rate as compared to conventional dry etching methods.

In the dry etching method of the present disclosure, examples of the workpiece include silicon substrates, compound semiconductor substrates, quartz substrates, and glass substrates. In addition to the film containing the metal or the oxide of the metal, a silicon film, a silicon oxide film, a silicon nitride film, a metal wiring film made of a metal other than the metal, or the like may be formed on the surface of the workpiece. For example, the workpiece may be placed in a placement unit of an etching device as described later, and the placement unit may be heated to heat the workpiece and the etching target film containing the metal or the oxide of the metal formed on the surface of the workpiece.

The etching target film may be formed on the surface of the workpiece by any method. Examples include chemical vapor deposition (CVD) and sputtering. Moreover, the etching target film containing the metal or the oxide of the metal may have any thickness, such as a thickness of 0.1 nm or more and 1 μm or less.

The etching gas used in the dry etching method of the present disclosure is the same as the gas used in the surface treatment method described above.

[Etching Device]

The dry etching method of the present disclosure can be accomplished, for example, using an etching device as described below. Such an etching device is also encompassed by the present disclosure.

The etching device of the present disclosure includes: a placement unit provided in a heatable processing vessel, for placing a workpiece on a surface of which an etching target film containing a metal or an oxide of the metal is formed; a β-diketone supply unit for supplying a β-diketone into the processing vessel; a first additive gas supply unit for supplying a first additive gas into the processing vessel; and a second additive gas supply unit for supplying a second additive gas into the processing vessel, wherein the first additive gas is NO, and the second additive gas is at least one selected from the group consisting of $O_2$ and $NO_2$. The etching device of the present disclosure may further include an inert gas supply unit for supplying an inert gas into the processing vessel.

FIG. 1 is a schematic view schematically showing an etching device according to an embodiment of the present disclosure.

The etching device 100 shown in FIG. 1 includes: a processing vessel 110 for placing a workpiece 112 on a surface of which an etching target film containing a metal or an oxide of the metal is formed; a β-diketone supply unit 130 that is connected to the processing vessel 110 to supply a gaseous β-diketone into the processing vessel 110; a NO gas supply unit (first additive gas supply unit) 140 for supplying gaseous NO into the processing vessel 110; an $O_2$ gas supply unit (second additive gas supply unit) 150 for supplying gaseous $O_2$ into the processing vessel 110; a $NO_2$ gas supply unit (second additive gas supply unit) 160 for supplying gaseous $NO_2$ into the processing vessel 110; an inert gas supply unit 170 for supplying an inert gas; and a heating means 180 for heating the processing vessel 110. It should be noted that the etching device 100 may not include the inert gas supply unit 170.

The etching device 100 further includes a control unit that is not shown in the FIGURE. For example, the control unit constitutes a computer and includes a program, a memory, and a CPU. In the program, a group of steps is incorporated to implement a series of operations in the etching method of the present invention. In accordance with the program, operations may be performed such as adjusting the temperature of the workpiece 112, opening or closing the valves of the supply units, adjusting the flow rates of the gases, adjusting the pressure in the processing vessel 110, etc. This program is stored in a computer storage medium such as a compact disk, a hard disk, a magneto-optical disk, or a memory card, and installed in the control unit.

The processing vessel 110 is provided with a placement unit 111 for placing the workpiece 112. The processing vessel 110 is not limited as long as it is resistant to the gases such as β-diketone used, heatable, and depressurizable to a predetermined pressure. Usually, a general processing vessel or the like provided in a semiconductor etching device may be used. The supply pipes for supplying the etching gases and other pipes, etc. are also not limited as long as they are resistant to the gases such as β-diketone. Any general pipes may be used.

The β-diketone supply unit 130 controls the amount of supply using valves V1 and V2 and a mass flow controller MFC1 to supply a β-diketone through pipes 131 and 133 to a pipe 121.

The NO gas supply unit 140 controls the amount of supply using valves V3 and V4 and a mass flow controller MFC2 to supply NO through pipes 141 and 143 to the pipe 121.

The $O_2$ gas supply unit 150 controls the amount of supply using valves V5 and V6 and a mass flow controller MFC3 to supply $O_2$ through pipes 151 and 153 to the pipe 121.

The $NO_2$ gas supply unit 160 controls the amount of supply using valves V7 and V8 and a mass flow controller MFC4 to supply $NO_2$ through pipes 161 and 163 to the pipe 121.

The inert gas supply unit 170 controls the amount of supply using valves V9 and V10 and a mass flow controller MFC5 to supply an inert gas through pipes 171 and 173 to the pipe 121.

The heating means 180 for heating the processing vessel 110 is disposed outside the processing vessel 110. A heater (not shown) may also be provided as a second heating means inside the placement unit 111. Here, when a plurality of placement units are provided in the processing vessel 110, each placement unit may be provided with a heater so that the temperature of the workpiece on each placement unit can be individually set to a predetermined temperature.

A gas discharge means for discharging the reacted gases is disposed on one side of the processing vessel 110. The reacted gases are discharged from the processing vessel 110 through a pipe 122 by a vacuum pump 123 of the gas discharge means. The reacted gases are collected by a liquid nitrogen trap 181 disposed between the pipe 122 and a pipe 124. Valves V11 and V12 may be disposed in the pipes 122 and 124, respectively, to control the pressure. Moreover, in FIG. 1, the reference signs PI1 and PI2 each indicate a pressure gauge, and the control unit can control the mass flow controllers and the valves according to the pressure gauge readings.

Examples of the etching target film that can be treated by the etching device of the present disclosure include those described above for the dry etching method.

An etching method is specifically described using the etching device 100 as an example.

[Dry Etching Method Using Above Etching Device]

In the dry etching method of the present disclosure, an etching gas containing a β-diketone, NO, and $O_2$, an etching gas containing a β-diketone, NO, and $NO_2$, or an etching gas containing a β-diketone, NO, $O_2$, and $NO_2$ is brought into contact with an etching target film.

In the dry etching method, first, a workpiece 112 on which an etching target film containing a metal or an oxide of the metal is formed is placed in the processing vessel 110. Next, the vacuum pump 123 is used to evacuate, to a predetermined pressure, the inside of the processing vessel 110, the pipe 121, the pipes 131 and 133, the pipes 141 and 143, the pipes 151 and 153, the pipes 161 and 163, the pipes 171 and 173, the liquid nitrogen trap 181, and the pipes 122 and 124. Subsequently, the workpiece 112 is heated by the heating means 180.

Once the workpiece 112 reaches a predetermined temperature, a β-diketone, a NO gas, and an $O_2$ gas are supplied from the β-diketone supply unit 130, the NO gas supply unit 140, and the $O_2$ gas supply unit 150, respectively, to the pipe 121 at respective predetermined flow rates; or a β-diketone, a NO gas, and a $NO_2$ gas are supplied from the β-diketone supply unit 130, the NO gas supply unit 140, and the $NO_2$ gas supply unit 160, respectively, to the pipe 121 at respective predetermined flow rates; or a β-diketone, a NO gas, an $O_2$ gas, and a $NO_2$ gas are supplied from the β-diketone supply unit 130, the NO gas supply unit 140, the $O_2$ gas supply unit 150, and the $NO_2$ gas supply unit 160, respectively, to the pipe 121 at respective predetermined flow rates. Here, an inert gas may be supplied from the inert gas supply unit 170 to the pipe 121 at a predetermined flow rate.

The β-diketone, NO, and $O_2$, or the β-diketone, NO, and $NO_2$, or the β-diketone, NO, $O_2$, and $NO_2$ are mixed in predetermined proportions and supplied to the processing vessel 110. The pressure in the processing vessel 110 is controlled to a predetermined pressure while introducing the mixed etching gas into the processing vessel 110. Etching is performed by allowing the etching gas to react with the etching target film containing a metal or an oxide of the metal for a predetermined period of time to form a complex. This etching method enables plasma less etching in a non-plasma state and eliminates the need to excite the etching gas by plasma or the like during etching. The flow rate of the etching gas may be appropriately set according to the capacity, pressure, and other conditions of the processing vessel.

It should be noted that etching in a plasma state refers to a process in which a gas or the like at a pressure of about 0.01 to 1.33 kPa, for example, is introduced into a reactor, and a high-frequency power is applied to an outer coil or a counter electrode to generate low-temperature gas plasma in the reactor, followed by etching with the active chemical species such as ions or radicals formed in the plasma.

The dry etching method of the present disclosure brings a gas into contact with a target in a non-plasma state to perform dry etching without generating the gas plasma described above.

After completion of the etching step, heating with the heating means 180 is stopped to lower the temperature, and the vacuum pump 123 is also stopped, followed by purging with an inert gas to release the vacuum. As described above, the dry etching method using the etching device described above can etch an etching target film containing a metal or an oxide of the metal.

(Etching Conditions in Dry Etching Method of Present Disclosure)

In the dry etching method of the present disclosure, the temperature of the etching target film during the etching step may be any temperature that allows the complex to vaporize. In particular, the temperature of the etching target film to be removed is preferably 250° C. or higher and 400° C. or lower, more preferably 275° C. or higher and 375° C. or lower, still more preferably 275° C. or higher and 350° C. or lower.

Moreover, the pressure in the processing vessel during the etching step is not limited, but it is usually in a pressure range of 0.1 kPa to 101.3 kPa.

To achieve a sufficient etching rate, the pressure in the processing vessel during the etching step is preferably 2.67 kPa or more and 39.9 kPa or less, more preferably 2.67 kPa or more and 26.7 kPa or less.

The processing time during the etching step is not limited, but it is preferably within 60 minutes, in view of the efficiency of the semiconductor device production process. Here, the processing time during the etching step refers to the time from when the etching gas is introduced into the processing vessel in which the workpiece has been provided until when the etching gas in the processing vessel is then discharged by a vacuum pump or the like to terminate the etching process.

[Semiconductor Device Production Method]

The dry etching method of the present disclosure described above can be used as an etching method for forming a predetermined pattern on a hafnium oxide film, hafnium metal, or the like in a conventional semiconductor device. Etching a hafnium oxide film, hafnium metal, or the like on a substrate by the dry etching method of the present disclosure enables low cost production of semiconductor devices.

The semiconductor device production method of the present disclosure includes allowing an etching target film containing a metal or an oxide of the metal on a substrate to react with an etching gas for etching in a non-plasma state, wherein the etching gas contains a β-diketone, a first additive gas, and a second additive gas, the first additive gas is NO, and the second additive gas is at least one selected from the group consisting of $O_2$ and $NO_2$.

The step of allowing the etching target film to react with an etching gas for etching in a non-plasma state can be performed by the dry etching method of the present disclosure described above.

[Cleaning Method]

The surface treatment method of the present disclosure described above can be used as a cleaning method for removing a deposit in a processing vessel of a substrate processing device, deposited on the surface of the processing vessel. Removing the deposit in the processing vessel using the cleaning method of the present disclosure allows for removal of even a highly stable material such as a hafnium oxide film or hafnium metal.

The cleaning method of the present disclosure is a cleaning method including bringing a gas into contact with a deposit in a processing vessel of a substrate processing device, deposited on a surface of the processing vessel, to remove the deposit, wherein the gas contains a β-diketone, a first additive gas, and a second additive gas, the first additive gas is NO, and the second additive gas is at least one selected from the group consisting of $O_2$ and $NO_2$.

The conditions and procedure for bringing the gas into contact with a deposit in a processing vessel of a substrate processing device, deposited on a surface of the processing vessel, and the deposit are the same as the conditions and procedure for bringing the gas into contact with a surface of a workpiece, and the material present on the surface of the workpiece in the surface treatment method described above.

In the cleaning method of the present disclosure, the gas in a plasma state may be brought into contact with the deposit, or the gas in a non-plasma state may be brought into contact with the deposit. The deposit may have any temperature when the gas is brought into contact therewith. For example, the temperature is 250° C. or higher and 400° C. or lower.

It should be noted that the disclosure herein includes the following embodiments of the invention.

(1) A surface treatment method, including: bringing a gas into contact with a surface of a workpiece, wherein the gas contains a β-diketone, a first additive gas, and a second additive gas, the first additive gas is NO, and the second additive gas is at least one selected from the group consisting of $O_2$ and $NO_2$.

(2) The surface treatment method according to (1) above, wherein the gas is brought into contact with the surface of the workpiece in a non-plasma state.

(3) The surface treatment method according to (1) or (2) above, wherein the gas is brought into contact with a metal or an oxide of the metal present on the surface of the workpiece.

(4) A dry etching method, including: bringing an etching gas into contact with an etching target film for etching in a non-plasma state, the etching target film being formed on a surface of a workpiece and containing a metal or an oxide of the metal, wherein the etching gas contains a β-diketone, a first additive gas, and a second additive gas, the first additive gas is NO, and the second additive gas is at least one selected from the group consisting of $O_2$ and $NO_2$.

(5) The dry etching method according to (4) above, wherein a temperature of the etching target film is 250° C. or higher and 400° C. or lower when the etching gas is brought into contact with the etching target film.

(6) The dry etching method according to (4) or (5) above, wherein the etching gas has a β-diketone content of 10 vol % or more and 90 vol % or less.

(7) The dry etching method according to any one of (4) to (6) above, wherein the etching gas has a first additive gas content of 0.1 vol, or more and 50 vol % or less.

(8) The dry etching method according to any one of (4) to (7) above, wherein the etching gas has a second additive gas content of 5 vol % or more and 40 vol % or less.

(9) The dry etching method according to any one of (4) to (8) above, wherein the metal or the oxide of the metal is at least one selected from the group consisting of group 4 metals, group 12 metals, group 13 metals, group 14 metals, and oxides of these metals.

(10) The dry etching method according to any one of (4) to (9) above, wherein the metal or the oxide of the metal is at least one selected from the group consisting of Hf, Zr, Ti, Ga, Al, In, Zn, and oxides of these metals.

(11) The dry etching method according to any one of (4) to (10) above, wherein the oxide of the metal is at least one selected from the group consisting of hafnium oxides, zirconium oxides, titanium oxides, gallium oxides, aluminum oxides, indium oxides, and zinc oxides.

(12) The dry etching method according to any one of (4) to (11) above, wherein the etching target film is at least one selected from the group consisting of hafnium oxide films, zirconium oxide films, titanium oxide films, gallium oxide films, aluminum oxide films, indium oxide films, zinc oxide films, hafnium metal films, zirconium metal films, titanium metal films, gallium metal films, aluminum metal films, indium metal films, and zinc metal films.

(13) The dry etching method according any one of (4) to (12) above, wherein the β-diketone is at least one selected from the group consisting of hexafluoroacetylacetone, trifluoroacetylacetone, and acetylacetone.

(14) The dry etching method according to any one of (4) to (13) above, wherein the etching gas further contains at least one inert gas selected from the group consisting of $N_2$, Ar, He, Ne, and Kr.

(15) The dry etching method according to any one of (4) to (14) above, wherein a pressure in a processing vessel in which the workpiece with the etching target film formed thereon is placed is in a pressure range of 0.1 kPa to 101.3 kPa when the etching gas is brought into contact with the etching target film.

(16) A cleaning method, including: bringing a gas into contact with a deposit in a processing vessel of a substrate processing device, deposited on a surface of the processing vessel, to remove the deposit, wherein the gas contains a β-diketone, a first additive gas, and a second additive gas, the first additive gas is NO, and the second additive gas is at least one selected from the group consisting of $O_2$ and $NO_2$.

(17) The cleaning method according to (16) above, wherein the deposit is a metal or an oxide of the metal.

(18) The cleaning method according to (16) or (17) above, wherein the metal or the oxide of the metal is at least one selected from the group consisting of group 4 metals, group 12 metals, group 13 metals, group 14 metals, and oxides of these metals.

(19) The cleaning method according to any one of (16) to (18) above, wherein the metal or the oxide of the metal is at least one selected from the group consisting of Hf, Zr, Ti, Ga, Al, In, Zn, and oxides of these metals.

(20) The cleaning method according to any one of (16) to (19) above, wherein the oxide of the metal is at least one selected from the group consisting of hafnium oxides, zirconium oxides, titanium oxides, gallium oxides, aluminum oxides, indium oxides, and zinc oxides.

(21) A semiconductor device production method, including: allowing an etching target film containing a metal or an oxide of the metal on a substrate to react with an etching gas for etching in a non-plasma state, wherein the etching gas contains a β-diketone, a first additive gas, and a second additive gas, the first additive gas is NO, and the second additive gas is at least one selected from the group consisting of $O_2$ and $NO_2$.

(22) The semiconductor device production method according to (21) above, wherein the etching target film is at least one selected from the group consisting of hafnium oxide films, zirconium oxide films, titanium oxide films, gallium oxide films, aluminum oxide films, indium oxide films, zinc oxide films, hafnium metal films, zirconium metal films, titanium metal films, gallium metal films, aluminum metal films, indium metal films, and zinc metal films.

(23) An etching device, including: a placement unit provided in a heatable processing vessel, for placing a workpiece on a surface of which an etching target film containing a metal or an oxide of the metal is formed; a β-diketone supply unit for supplying a β-diketone into the processing vessel; a first additive gas supply unit for supplying a first additive gas into the processing vessel; and a second additive gas supply unit for supplying a second additive gas into the processing vessel, wherein the first additive gas is NO, and the second additive gas is at least one selected from the group consisting of $O_2$ and $NO_2$.

(24) The etching device according (23) above, further including an inert gas supply unit for supplying an inert gas into the processing vessel.

(25) The etching device according to (23) or (24) above, wherein the etching target film is at least one selected from the group consisting of hafnium oxide films, zirconium oxide films, titanium oxide films, gallium oxide films, aluminum oxide films, indium oxide films, zinc oxide films, hafnium metal films, zirconium metal films, titanium metal films, gallium metal films, aluminum metal films, indium metal films, and zinc metal films.

EXAMPLES

Hereinafter, examples that specifically disclose the present disclosure are described. It should be noted that the present disclosure is not limited to these examples.

Example 1

The etching device 100 shown in FIG. 1 was used to etch a workpiece 112 including a silicon wafer (shape: 1 cm×1 cm; thickness: 1000 μm) and an etching target film made of a hafnium oxide ($HfO_2$) film (shape: 1 cm×1 cm; film thickness: 220 nm) formed on the surface of the silicon wafer.

The inside of the processing vessel 110, the pipes 121 and 122, the pipe 133, the pipe 143, the pipe 153, the pipe 163, the pipe 173, and the liquid nitrogen trap 181 was evacuated to lower than 10 Pa. Then, the workpiece 112 placed on the placement unit 111 was heated by the heating means 180 and a heater disposed within the placement unit 111. After confirming that the temperature of the workpiece 112 had reached 350° C., gaseous hexafluoroacetylacetone (HFAc) from the β-diketone supply unit 130, a NO gas from the NO gas supply unit 140, and an $O_2$ gas from the $O_2$ gas supply unit 150 were supplied to the pipes 133, 143, and 153, respectively, at respective predetermined flow rates to introduce the etching gases into the processing vessel 110 while controlling the pressure in the processing vessel 110 to 14.0 kPa, whereby an etching step was performed. The temperature of the workpiece 112 was set to 350° C., and the etching gas flow rates were set as follows: HFAc=10 sccm, NO=5 sccm, and $O_2$=2.5 sccm. After ten minutes had elapsed since the introduction of the etching gases started, the introduction of the etching gases was stopped. Subsequently, the inside of the processing vessel 110 was evacuated to lower than 10 Pa and purged with a $N_2$ gas supplied from the inert gas supply unit 170. The workpiece 112 was then taken out, and the film thickness was measured to evaluate the etching rate. Table 1 shows the results.

It should be noted that Examples 1 to 16 including Examples 2 to 16 below each used a dry etching method of bringing the etching gas A or etching gas B described below into contact with an etching target film. In Comparative Examples 1, 2, 6, 7, 12, 13, 17, 18, 23, 24, 28, and 29, the etching gas C described below was brought into contact with an etching target film. In Comparative Examples 4, 8 to 10, 15, 19 to 21, 26, and 31, the etching gas D described below was brought into a contact with an etching target film. In Comparative Examples 3, 14, 25, and 30, the etching gas E described below was brought into contact with an etching target film. In Comparative Examples 5, 11, 16, 22, 27, and 32, the etching gas F described below was brought into contact with an etching target film.

Etching gas A: HFAc, NO, and $O_2$
Etching gas B: HFAc, NO, and $NO_2$
Etching gas C: HFAc and NO
Etching gas D: HFAc and $NO_2$
Etching gas E: HFAc and $O_2$
Etching gas F: HFAc, $O_2$, and $NO_2$ When NO$_2$ was used as an etching gas, a NO$_2$ gas was supplied from the NO$_2$ gas supply unit 160 to the pipe 163 and introduced into the processing vessel 110 together with HFAc and NO.

In all the examples and comparative examples, HFAc as a β-diketone was supplied at 10 sccm.

Example 2, Comparative Examples 1 to 5

Table 1 below shows the type of additive gas in etching, the flow rate of each additive gas, the pressure in the processing vessel, the temperature during etching, and the etching rate.

film made of a 220-nm-thick zirconium oxide (ZrO$_2$) film, a 60-nm-thick titanium oxide (TiO$_2$) film, or a 90-nm-thick gallium oxide (Ga$_2$O$_3$) film formed on the surface of the silicon wafer.

The material of the etching target film, the thickness of the etching target film, the type and flow rate of each additive gas in etching, the pressure in the processing vessel, and the temperature of the workpiece 112 during etching were changed as shown in Table 1. The procedure was otherwise performed in the same manner as in Example 1, and the etching rate of the etching target film was evaluated. Table 1 shows the results.

TABLE 1

| | Etching target film | First additive gas | | Second additive gas | | Pressure [kPa] | Temperature [° C.] | Etching rate [nm/min] |
|---|---|---|---|---|---|---|---|---|
| | | Type | Flow rate [sccm] | Type | Flow rate [scom] | | | |
| Example 1 | HfO$_2$ | A | NO | 5 | O$_2$ | 2.5 | 14.0 | 350 | 1.1 |
| Example 2 | HfO$_2$ | B | NO | 1 | NO$_2$ | 5 | 12.8 | 350 | 2.8 |
| Comparative Example 1 | HfO$_2$ | C | NO | 5 | — | | 12.0 | 350 | 0.0 |
| Comparative Example 2 | HfO$_2$ | C | NO | 1 | — | | 8.8 | 350 | 0.0 |
| Comparative Example 3 | HfO$_2$ | E | — | | O$_2$ | 2.5 | 10.0 | 350 | 0.0 |
| Comparative Example 4 | HfO$_2$ | D | — | | NO$_2$ | 5 | 12.0 | 350 | 0.3 |
| Comparative Example 5 | HfO$_2$ | F | — | | O$_2$ + NO$_2$ | 5 + 5 | 14.0 | 350 | 0.3 |
| Example 3 | ZrO$_2$ | A | NO | 5 | O$_2$ | 2.5 | 14.0 | 350 | 7.1 |
| Example 4 | ZrO$_2$ | B | NO | 1 | NO$_2$ | 5 | 12.8 | 350 | 19.7 |
| Example 5 | ZrO$_2$ | B | NO | 2.5 | NO$_2$ | 5 | 14.0 | 300 | 3.4 |
| Example 6 | ZrO$_2$ | B | NO | 7.5 | NO$_2$ | 5 | 18.0 | 250 | 0.1 |
| Comparative Example 6 | ZrO$_2$ | C | NO | 5 | — | | 12.0 | 350 | 0.0 |
| Comparative Example 7 | ZrO$_2$ | C | NO | 1 | — | | 8.8 | 350 | 0.0 |
| Comparative Example 8 | ZrO$_2$ | D | — | | NO$_2$ | 5 | 12.0 | 350 | 1.9 |
| Comparative Example 9 | ZrO$_2$ | D | — | | NO$_2$ | 5 | 12.0 | 300 | 0.2 |
| Comparative Example 10 | ZrO$_2$ | D | — | | NO$_2$ | 5 | 12.0 | 250 | 0.0 |
| Comparative Example 11 | ZrO$_2$ | F | — | | O$_2$ + NO$_2$ | 5 + 5 | 14.0 | 350 | 1.6 |
| Example 7 | TiO$_2$ | A | NO | 5 | O$_2$ | 2.5 | 14.0 | 350 | 0.5 |
| Example 8 | TiO$_2$ | B | NO | 1 | NO$_2$ | 5 | 12.8 | 350 | 0.7 |
| Comparative Example 12 | TiO$_2$ | C | NO | 5 | — | | 12.0 | 350 | 0.0 |
| Comparative Example 13 | TiO$_2$ | C | NO | 1 | — | | 8.8 | 350 | 0.0 |
| Comparative Example 14 | TiO$_2$ | E | — | | O$_2$ | 2.5 | 10.0 | 350 | 0.0 |
| Comparative Example 15 | TiO$_2$ | D | — | | NO$_2$ | 5 | 12.0 | 350 | 0.4 |
| Comparative Example 16 | TiO$_2$ | F | — | | O$_2$ + NO$_2$ | 5 + 5 | 14.0 | 350 | 0.1 |
| Example 9 | Ga$_2$O$_3$ | A | NO | 5 | O$_2$ | 2.5 | 14.0 | 350 | 11.2 |
| Example 10 | Ga$_2$O$_3$ | B | NO | 1 | NO$_2$ | 5 | 12.8 | 350 | 25.3 |
| Example 11 | Ga$_2$O$_3$ | B | NO | 5 | NO$_2$ | 5 | 14.0 | 300 | 7.4 |
| Example 12 | Ga$_2$O$_3$ | B | NO | 10 | NO$_2$ | 5 | 18.0 | 250 | 0.4 |
| Comparative Example 17 | Ga$_2$O$_3$ | C | NO | 5 | — | | 12.0 | 350 | 0.0 |
| Comparative Example 18 | Ga$_2$O$_3$ | C | NO | 1 | — | | 8.8 | 350 | 0.0 |
| Comparative Example 19 | Ga$_2$O$_3$ | D | — | | NO$_2$ | 5 | 12.0 | 350 | 7.1 |
| Comparative Example 20 | Ga$_2$O$_3$ | D | — | | NO$_2$ | 5 | 12.0 | 300 | 1.0 |
| Comparative Example 21 | Ga$_2$O$_3$ | D | — | | NO$_2$ | 5 | 12.0 | 250 | 0.0 |
| Comparative Example 22 | Ga$_2$O$_3$ | F | — | | O$_2$ + NO$_2$ | 5 + 5 | 14.0 | 350 | 2.6 |

The following explains how Example 2 and Comparative Examples 1 to 5 are different from Example 1. In Example 2, the flow rate of NO as the additive gas was changed, and NO$_2$ instead of O$_2$ was supplied at 5 sccm. In Comparative Examples 1 and 2, only NO was used as the additive gas. In Comparative Example 3, only O$_2$ was used as the additive gas. In Comparative Example 4, only NO$_2$ was used as the additive gas. In Comparative Example 5, O$_2$ and NO$_2$ were used as the additive gases. The procedure was otherwise performed in the same manner as in Example 1, and the etching rate of the etching target film was evaluated. Table 1 shows the results.

Examples 3 to 12, Comparative Examples 6 to 22

The etching device 100 shown in FIG. 1 was used to etch a workpiece including a silicon wafer and an etching target A comparison of Examples 1 and 2 with Comparative Examples 1 to 3 shows that the etching gas C (a gas mixture of HFAc and NO) and the etching gas E (a gas mixture of HFAc and O$_2$) cannot etch the HfO$_2$ film, whereas the etching gas A (a gas mixture of HFAc, NO, and O$_2$) and the etching gas B (a gas mixture of HFAc, NO, and NO$_2$) can etch the HfO$_2$ film. Also, a comparison of Example 2 with Comparative Example 4 shows that the etching gas D (a gas mixture of HFAc and NO$_2$) etches the HfO$_2$ film at an etching rate of 0.3 nm/min, whereas the etching gas B etches the HfO$_2$ film at an etching rate of 2.8 nm/min, and that adding NO to the gas mixture of HFAc and NO$_2$ significantly improves the etching rate of the HfO$_2$ film. These were unexpected results, considering that the gas mixture of HFAc and NO cannot etch the HfO$_2$ film. Also, a comparison of Comparative Example 4 with Comparative Example 5 shows that the etching gas D etches the $HfO_2$ film at an etching rate of 0.3 nm/min, whereas the etching gas F also etches the $HfO_2$ film at an etching rate of 0.3 nm/min, and that adding $O_2$ to the gas mixture of HFAc and $NO_2$ does not have an improving effect on the etching of the $HfO_2$ film.

A comparison of Examples 3 to 6 with Comparative Examples 6 and 7 shows that the etching gas C cannot etch the $ZrO_2$ film, whereas the etching gas A and the etching gas B can etch the $ZrO_2$ film. Also, a comparison of Examples 4 and 5 with Comparative Examples 8 and 9 shows that when the etching gas is brought into contact with the workpiece having a temperature of 350° C. or 300° C., adding NO to the gas mixture of HFAc and $NO_2$ significantly improves the etching rate of the $ZrO_2$ film.

Also, a comparison of Example 6 with Comparative Example 10 shows that when the etching gas is brought into contact with the workpiece having a temperature of 250° C., the etching gas D cannot etch the $ZrO_2$ film, whereas etching gas B can etch the $ZrO_2$ film.

Also, a comparison of Comparative Example 8 with Comparative Example 11 shows that the etching gas D etches the $ZrO_2$ film at 350° C. at an etching rate of 1.9 nm/min, whereas the etching gas F etches the $ZrO_2$ film at 350° C. at an etching rate of 1.6 nm/min, and that adding $O_2$ to the gas mixture of HFAc and $NO_2$ reduces the etching rate of the $ZrO_2$ film.

A comparison of Examples 7 and 8 with Comparative Examples 12 to 14 shows that the etching gas C and the etching gas E cannot etch the $TiO_2$ film, whereas the etching gas A and the etching gas B can etch the $TiO_2$ film. Also, a comparison of Example 8 with Comparative Example 15 shows that the etching gas D etches the $TiO_2$ film at an etching rate of 0.4 nm/min, whereas the etching gas B etches the $TiO_2$ film at an etching rate of 0.7 nm/min, and that adding NO to the gas mixture of HFAc and $NO_2$ significantly improves the etching rate of the $TiO_2$ film. These were unexpected results, considering that the gas mixture of HFAc and NO cannot etch the $TiO_2$ film.

A comparison of Examples 9 to 12 with Comparative Examples 17 and 18 shows that the etching gas C cannot etch the $Ga_2O_3$ film, whereas the etching gas A and the etching gas B can etch the $Ga_2O_3$ film. Also, a comparison of Examples 10 and 11 with Comparative Examples 19 and 20 shows that when the etching gas is brought into contact with the workpiece having a temperature of 350° C. or 300° C., adding NO to the gas mixture of HFAc and $NO_2$ significantly improves the etching rate of the $Ga_2O_3$ film.

Also, a comparison of Example 12 with Comparative Example 21 shows that when the etching gas is brought into contact with the workpiece having a temperature of 250° C., the etching gas D cannot etch the $Ga_2O_3$ film, whereas the etching gas B can etch the $Ga_2O_3$ film.

Also, a comparison of Comparative Example 19 with Comparative Example 22 shows that the etching gas D etches the $Ga_2O_3$ film at 350° C. at an etching rate of 7.1 nm/min, whereas the etching gas F etches the $Ga_2O_3$ film at 350° C. at an etching rate of 2.6 nm/min, and that adding $O_2$ to the gas mixture of HFAc and $NO_2$ reduces the etching rate of the $Ga_2O_3$ film.

Examples 13 to 16, Comparative Examples 23 to 32

The etching device 100 shown in FIG. 1 was used to etch a workpiece including a silicon wafer and an etching target film made of a 90-nm-thick indium oxide film or a 100-nm-thick indium-gallium-zinc oxide ($InGaZnO_4$) film formed on the surface of the silicon wafer.

The material of the etching target film, the type and flow rate of the etching gas, the pressure in the processing vessel, and the temperature of the workpiece during etching were changed as shown in Table 2. The procedure was otherwise performed in the same manner as in Example 1, and the etching rate of the etching target film was evaluated. Table 2 shows the results.

TABLE 2

| | Etching target film | | Etching gas | | | | | | Etching rate [nm/min] |
| | | | First additive gas | | Second additive gas | | Pressure [kPa] | Temperature [° C.] | |
| | | | Type | Flow rate [sccm] | Type | Flow rate [sccm] | | | |
|---|---|---|---|---|---|---|---|---|---|
| Example 13 | $In_2O_3$ | A | NO | 5 | $O_2$ | 2.5 | 14.0 | 300 | 1.2 |
| Example 14 | $In_2O_3$ | B | NO | 1 | $NO_2$ | 5 | 12.8 | 300 | 1.5 |
| Comparative Example 23 | $In_2O_3$ | C | NO | 5 | — | | 12.0 | 300 | 0.0 |
| Comparative Example 24 | $In_2O_3$ | C | NO | 1 | — | | 8.8 | 300 | 0.0 |
| Comparative Example 25 | $In_2O_3$ | E | — | | $O_2$ | 2.5 | 10.0 | 300 | 0.0 |
| Comparative Example 26 | $In_2O_3$ | D | — | | $NO_2$ | 5 | 12.0 | 300 | 0.5 |
| Comparative Example 27 | $In_2O_3$ | F | — | | $O_2 + NO_2$ | 5 + 5 | 14.0 | 300 | 0.3 |
| Example 15 | $InGaZnO_4$ | A | NO | 5 | $O_2$ | 2.5 | 14.0 | 300 | 3.6 |
| Example 16 | $InGaZnO_4$ | B | NO | 1 | $NO_2$ | 5 | 12.8 | 300 | 5.8 |
| Comparative Example 28 | $InGaZnO_4$ | C | NO | 5 | — | | 12.0 | 300 | 0.0 |
| Comparative Example 29 | $InGaZnO_4$ | C | NO | 1 | — | | 8.8 | 300 | 0.0 |
| Comparative Example 30 | $InGaZnO_4$ | E | — | | $O_2$ | 2.5 | 10.0 | 300 | 0.0 |
| Comparative Example 31 | $InGaZnO_4$ | D | — | | $NO_2$ | 5 | 12.0 | 300 | 2.4 |
| Comparative Example 32 | $InGaZnO_4$ | F | — | | $O_2 + NO_2$ | 5 + 5 | 14.0 | 300 | 2.0 |

Also, a comparison of Comparative Example 15 with Comparative Example 16 shows that the etching gas D (a gas mixture of HFAc and $NO_2$) etches the $TiO_2$ film at an etching rate of 0.4 nm/min, whereas the etching gas F etches the $TiO_2$ film at an etching rate of 0.1 nm/min, and that adding $O_2$ to the gas mixture of HFAc and $NO_2$ reduces the etching rate of the $TiO_2$ film.

A comparison of Examples 13 and 14 with Comparative Examples 23 to 25 shows that the etching gas C and the etching gas E cannot etch the $In_2O_3$ film, whereas the etching gas A and the etching gas B can etch the $In_2O_3$ film. Also, a comparison of Example 14 with Comparative Example 26 shows that the etching gas D etches the $In_2O_3$ film at an etching rate of 0.5 nm/min, whereas the etching gas B etches the $In_2O_3$ film at an etching rate of 1.5 nm/min, and that adding NO to the gas mixture of HFAc and $NO_2$ significantly improves the etching rate of the $In_2O_3$ film. These were unexpected results, considering that the gas mixture of HFAc and NO cannot etch the $In_2O_3$ film.

Also, a comparison of Comparative Example 26 with Comparative Example 27 shows that the etching gas D (a gas mixture of HFAc and $NO_2$) etches the $In_2O_3$ film at an etching rate of 0.5 nm/min, whereas the etching gas F etches the $In_2O_3$ film at an etching rate of 0.3 nm/min, and that adding $O_2$ to the gas mixture of HFAc and $NO_2$ reduces the etching rate of the $In_2O_3$ film.

A comparison of Examples 15 and 16 with Comparative Examples 28 to 30 shows that the etching gas C and the etching gas E cannot etch the $InGaZnO_4$ film, whereas the etching gas A and the etching gas B can etch the $InGaZnO_4$ film. Also, a comparison of Example 16 with Comparative Example 31 shows that the etching gas D etches the $InGaZnO_4$ film at an etching rate of 2.4 nm/min, whereas the etching gas B etches the $InGaZnO_4$ film at an etching rate of 5.8 nm/min, and that adding NO to the gas mixture of HFAc and $NO_2$ significantly improves the etching rate of the $InGaZnO_4$ film. These were unexpected results, considering that the gas mixture of HFAc and NO cannot etch the $InGaZnO_4$ film.

Also, a comparison of Comparative Example 31 with Comparative Example 32 shows that the etching gas D (a gas mixture of HFAc and $NO_2$) etches the $InGaZnO_4$ film at an etching rate of 2.4 nm/min, whereas the etching gas F etches the $InGaZnO_4$ film at an etching rate of 2.0 nm/min, and that adding $O_2$ to the gas mixture of HFAc and $NO_2$ reduces the etching rate of the $InGaZnO_4$ film.

The present application claims priority under the Paris Convention and the law of the designated state to Japanese Patent Application No. 2021-075900 filed on Apr. 28, 2021, the entire contents of which are hereby incorporated by reference.

REFERENCE SIGNS LIST

100 etching device
110 processing vessel
111 placement unit
112 workpiece
121, 122, 124 pipe
123 vacuum pump
130 β-diketone supply unit
131, 133 pipe
140 NO gas supply unit (first additive gas supply unit)
141, 143 pipe
150 $O_2$ gas supply unit (second additive gas supply unit)
151, 153 pipe
160 $NO_2$ gas supply unit (second additive gas supply unit)
161, 163 pipe
170 inert gas supply unit
171, 173 pipe
180 heating means
181 liquid nitrogen trap
MFC1, MFC2, MFC3, MFC4, MFC5 mass flow controller
PI1, PI2 pressure gauge
V1, V2, V3, V4, V5, V6, V7, V8, V9, V10, V11, V12 valve

The invention claimed is:

1. A dry etching method, comprising:

bringing an etching gas into contact with an etching target film for etching in a non-plasma state, the etching target film being formed on a surface of a workpiece and containing a metal or an oxide of the metal, wherein the etching gas contains a β-diketone, a first additive gas, and second additive gas, the first additive gas is NO, the second additive gas is at least one selected from the group consisting of $O_2$ and $NO_2$, and the metal or the oxide of the metal is at least one selected from the group consisting of group 13 metals, group 14 metals, and oxides of these metals.

\* \* \* \* \*